(12) United States Patent
Lu et al.

(10) Patent No.: US 8,664,540 B2
(45) Date of Patent: Mar. 4, 2014

(54) INTERPOSER TESTING USING DUMMY CONNECTIONS

(75) Inventors: Hsiang-Tai Lu, Zhubei (TW);
Chih-Hsien Lin, Tai-Chung (TW);
Wei-Sho Hung, Beigang Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 406 days.

(21) Appl. No.: 13/118,129

(22) Filed: May 27, 2011

(65) Prior Publication Data

US 2012/0298410 A1 Nov. 29, 2012

(51) Int. Cl.
*H05K 1/11* (2006.01)
(52) U.S. Cl.
USPC .......... 174/264; 174/40 R; 257/713; 438/106; 438/107; 438/108; 438/109
(58) Field of Classification Search
USPC .......... 174/264, 40 R; 257/713; 438/106–109
See application file for complete search history.

(56) References Cited

U.S. PATENT DOCUMENTS

| 7,598,523 | B2 | 10/2009 | Luo et al. | |
|---|---|---|---|---|
| 2004/0021139 | A1* | 2/2004 | Jackson et al. | 257/40 |
| 2004/0121521 | A1* | 6/2004 | Jackson et al. | 438/108 |
| 2005/0186705 | A1* | 8/2005 | Jackson et al. | 438/106 |
| 2008/0153204 | A1* | 6/2008 | Jackson et al. | 438/109 |
| 2009/0011539 | A1* | 1/2009 | Jeng et al. | 438/107 |
| 2009/0057880 | A1* | 3/2009 | Baek et al. | 257/713 |

* cited by examiner

*Primary Examiner* — Xiaoliang Chen
(74) *Attorney, Agent, or Firm* — Slater & Matsil, L.L.P.

(57) ABSTRACT

An interconnection component includes a substrate, and an active through-substrate via (TSV) penetrating through the substrate. Active metal connections are formed over the substrate and electrically connected to the active TSV. At least one of a dummy pad and a dummy solder bump are formed at surfaces of the interconnection component. The dummy pad is over the substrate and electrically connected to the active TSV and the active metal connections. The dummy solder bump is under the substrate and electrically connected to the active metal connections. The dummy pad and the dummy solder bump are open ended.

5 Claims, 12 Drawing Sheets

INTERPOSER TESTING USING DUMMY CONNECTIONS

BACKGROUND

In three-dimensional integrated circuits, interposers are used for bonding devices thereon. Interposers are often passive interposers, wherein there are no active devices such as transistors formed in the interposers. Through-substrate vias (TSVs) are used to make electrical connections from one side of an interposer to the opposite side. Further, there may be metal routing layers on one side or both sides of an interposer, and the metal routing layers are used to electrically connect solder bumps on the surface of the interposer to the TSVs, and to electrically interconnect the solder bumps.

Conventionally, due to the fact that the connections in the interposers are often open connections before the interposers are bonded to other package components, it is difficult to test the interposers efficiently. Although additional test structures may be formed and attached to the interposers to provide loopback, the cost for forming the extra devices that have the loopback structures is involved.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A structure for testing the reliability of interconnection components and the methods for performing the testing are provided in accordance with an embodiment. The variations and the operation of the embodiment are then discussed. Throughout the various views and illustrative embodiments, like reference numbers are used to designate like elements.

Figure 1:
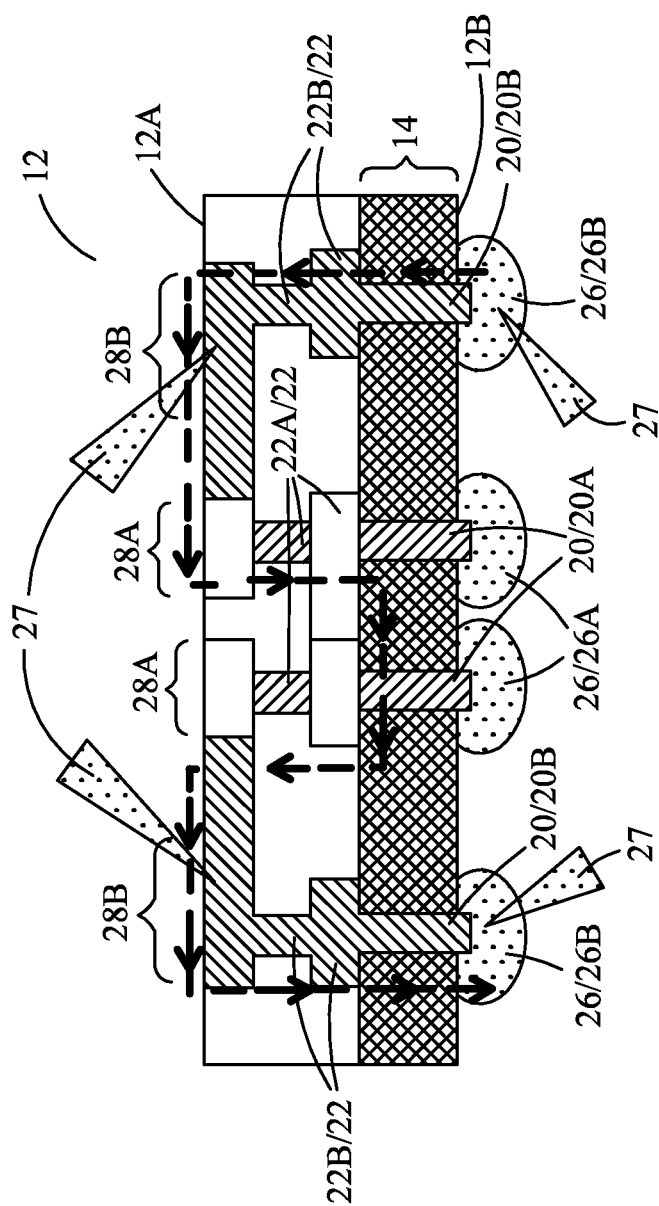
FIG. 1 illustrates the cross-sectional view of an interconnection component in accordance with an embodiment, wherein the interconnection component comprises dummy pads, dummy through-substrate vias (TSVs), and dummy solder bumps.

FIG. 1 illustrates a cross-sectional view of interconnection component 12, which is configured to make electrical connections from major surface 12A to major surface 12B, with major surfaces 12A and 12B being opposite surfaces of interconnection component 12. In an embodiment, interconnection component 12 is an interposer, and hence is alternatively referred to as interposer 12 hereinafter, although it may also be another type of interconnection component such as a package substrate. Interposer 12 includes substrate 14, which may be formed of a semiconductor material such as silicon, although other commonly used semiconductor materials, conductive materials, or dielectric materials may also be used. Interposer 12 may be a passive interposer with no active devices (such as transistors) formed therein.

TSVs 20 (including 20A and 20B) are formed in substrate 14, and penetrate through substrate 14. Metal connections 22, which include metal lines and vias, may be formed on one or both sides of substrate 14, and electrically coupled to TSVs 20. Throughout the description, letter "A" may be post-suffixed to active features, which have the function of conducting voltages and currents. Active features may include active metal lines/vias, active TSVs, active solder bumps, and the like. In FIG. 1, there are active TSVs 20A, active metal connections 22A, active solder bumps 26A, and active pads 28A.

Letter "B" may be post-suffixed to dummy features that are used for testing the active features. The dummy features may include dummy metal lines/vias 22B, dummy TSVs 20B, dummy solder bumps 26B, dummy pads 28B, and the like. The operation of the resulting package structure is not affected if the dummy features are removed. Furthermore, during the operation of the package structure including interconnection component 12, no current is able to flow through the dummy features when the packaging of package 10 (FIG. 2) is finished, and when package 10 is powered on for operation. For example, since dummy pads 28B and dummy solder bumps 26B are open ended (regardless of whether there are metal features connected to them), no current can flow through dummy pads 28B.

Dummy TSVs 20B, dummy pads 28B, dummy metal connections 22B, dummy solder bumps 26B and the respective dummy bond pads (not shown) that contact dummy solder bumps 26B, if any, are formed for testing interconnection component 12, and are electrically connected to active TSVs 20A, active pads 28A, active metal connections 22A, and active solder bumps 26A. Active pads 28A and dummy pads 28B are formed at front side 12A of interconnection component 12. Active solder bumps 26A and dummy solder bumps 26B are formed at the back surface 12B of interconnection component 12. A backside probing may be performed through dummy solder bumps 26B, (or through the dummy bond pads if dummy solder bumps 26B are not formed on the dummy bond pads), using a probe card comprising probe pins 27. The dashed lines and arrows illustrate the current route of the backside probing. It is observed that defect connections (including shorts and open connections) in interconnection component 12 may be found through the backside probing between two dummy solder bumps 26B. Alternatively, the backside probing may be performed between one dummy solder bump 26B and one active bump 26A. A front side probing may be performed through dummy pads 28B, for example, by contacting probe pins 27 with dummy pads 28B. Similarly, the defect connections between two dummy pads 28B may be found through the front side probing.

Figure 2:
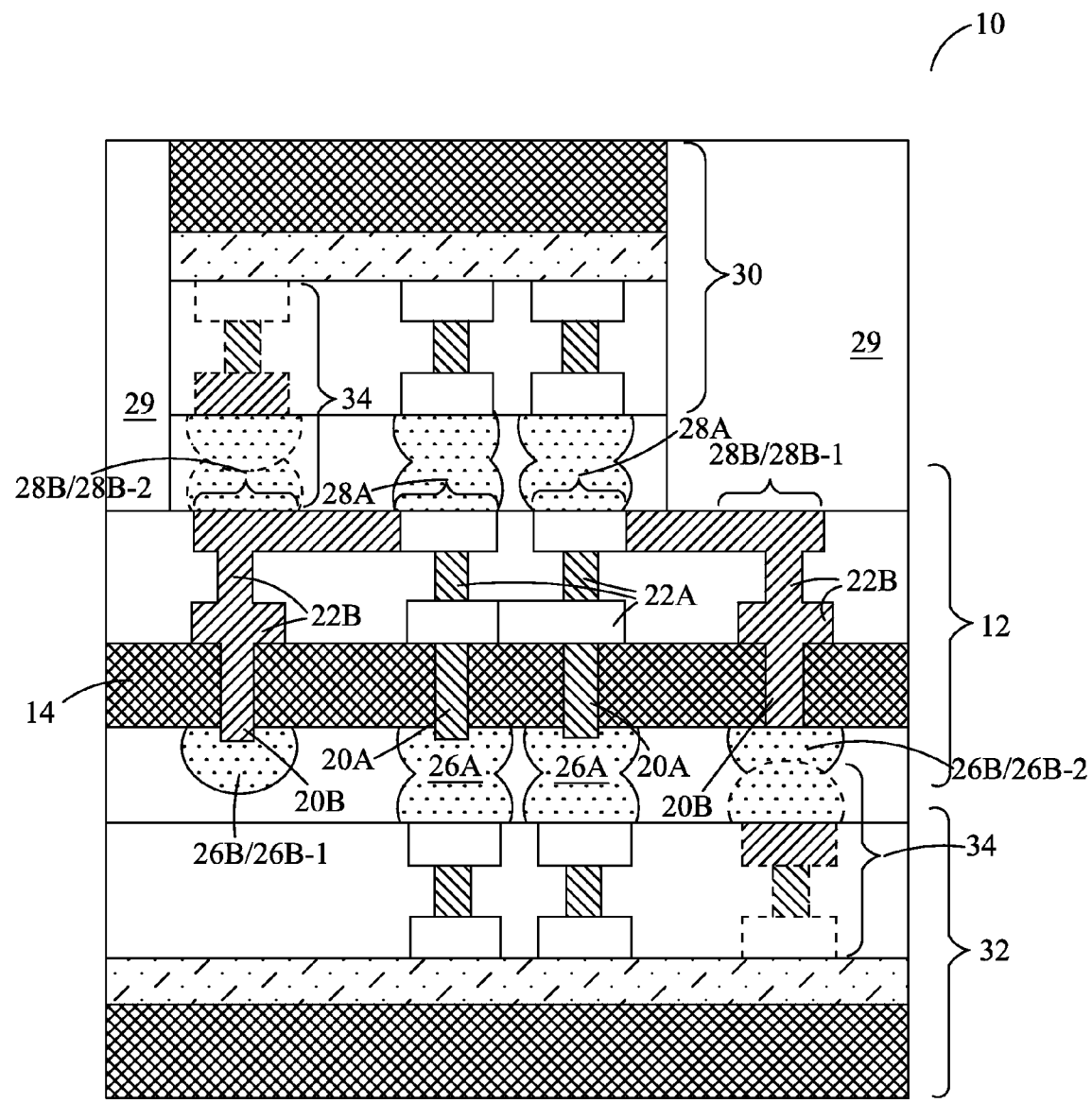
FIG. 2 illustrates a package comprising the interconnection component as shown in FIG. 1 and additional package components bonded to opposite sides of the interconnection component.

FIG. 2 illustrates a cross-sectional view of package 10, which includes interconnection component 12 bonded to package components 30 and 32. Each of package components 30 and 32 may be a device die, a package substrate, an interposer, a printed circuit board, or the like. In an embodiment, each of dummy pads 28B is open ended, which means it is not connected to other conductive features in any overlying package components including package component 30. Similarly, each of dummy solder bumps 26B is open ended, which means it is not connected to other conductive features in (and penetrating through) any underlying package components including package component 32. For example, in FIG. 2, dummy pad 28B-1, which is between interconnection component 12 and package component 32 is open ended, and is not connected to any other metal feature after the packaging of package 10 is finished. During the subsequent packaging process, dummy pad 28B-1 may be covered by, and possibly in physical contact with, molding compound 29. Similarly, dummy solder bump 26B-1, which is between substrate 14 and package component 32, is not electrically connected to any feature in package component 32. Alternatively, exemplary dummy pads 28B-2 and dummy solder bumps 26B-2 may be bonded to optional metal features 34 in package components 30 and 32. Metal features 34, however, are open ended, as symbolized by the "X" marks, indicating that the electrical connections stop at the "X" marks, and no current flows through metal features 34 during the normal operation of package 10. After the bonding of components 12, 30, and 32, additional probing may still be performed through metal features 34.

Figure 3:
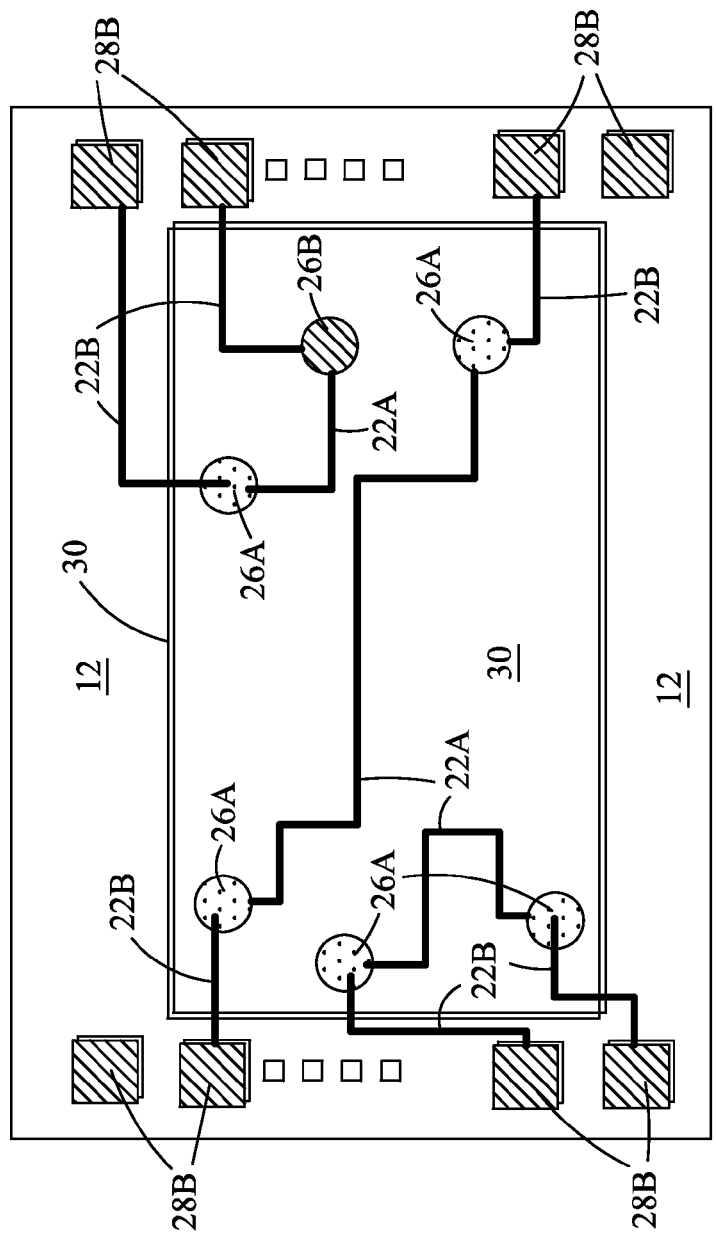
FIG. 3 illustrates a schematic top view of the package shown in FIG. 2.

FIG. 3 illustrates a schematic top view of exemplary package 10. In an embodiment, after package component 30 is bonded to interconnection component 12, some or all dummy pads 28B are not covered by package component 30. Accordingly, after the bonding, the front side probing may still be performed on dummy pads 28B to find the defect connections in interconnection component 12, and to find the defect connections between interconnection component 12 and package components 30 and/or 32. Since dummy pads 28B are not covered by package component 30, if molding compound 29 (not shown in FIG. 3, please refer to FIG. 2) is formed, molding compound 29 may cover, and possibly in physical contact with, dummy pads 28B, or any dummy solder bumps over and in physical contact with dummy pads 28B. Alternatively, package component 30 may cover dummy pads 28B, as illustrated as dummy pad 28B-2.

Figure 4:
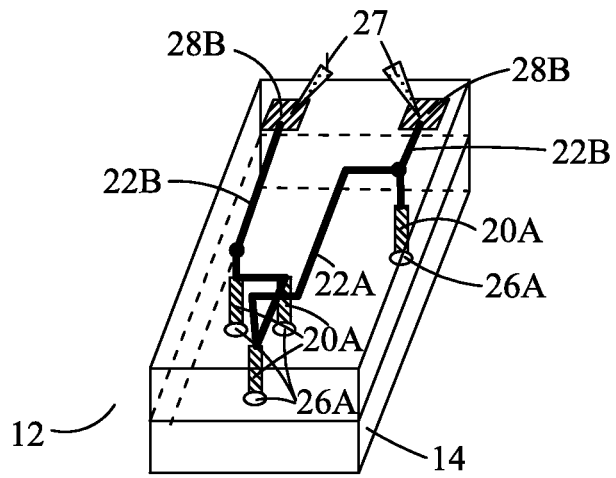
FIGS. 4 and 5 are perspective views of interconnection components in accordance with embodiments.
Figure 5:
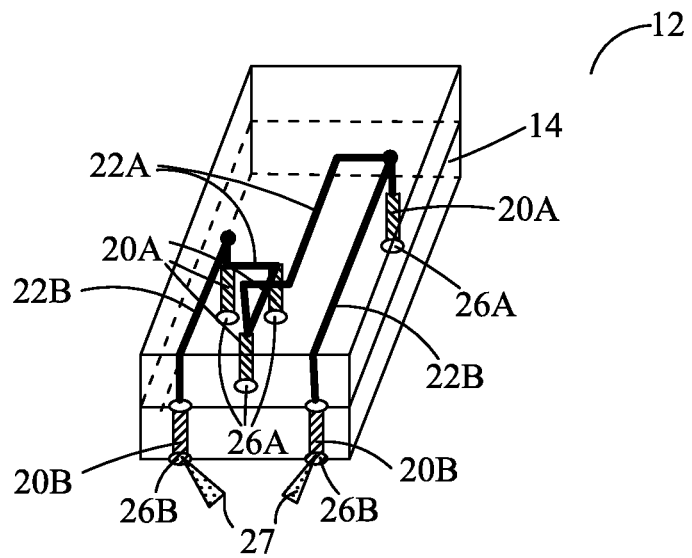

FIGS. 4 and 5 are perspective views of exemplary interconnection components 12. In FIG. 4, dummy pads 28B are illustrated, and are electrically connected to active connections 22A, dummy connections 22B, and active TSVs 20A. In FIG. 4, although package component 30 (please refer to FIG. 2) is not shown, it may, or may not, be bonded to interconnection components 12 when the probing (symbolized by probe pins 27) using dummy pads 28B is performed. In FIG. 5, dummy TSVs 20B are illustrated, and are electrically connected to active metal connections 22A, dummy connections 22B, and active TSVs 20A. In FIG. 5, although package component 32 (please refer to FIG. 2) is not shown, it may, or may not, be bonded to interconnection components 12 when the probing (symbolized by probe pins 27) through dummy solder bumps 26B is performed.

Figure 6:
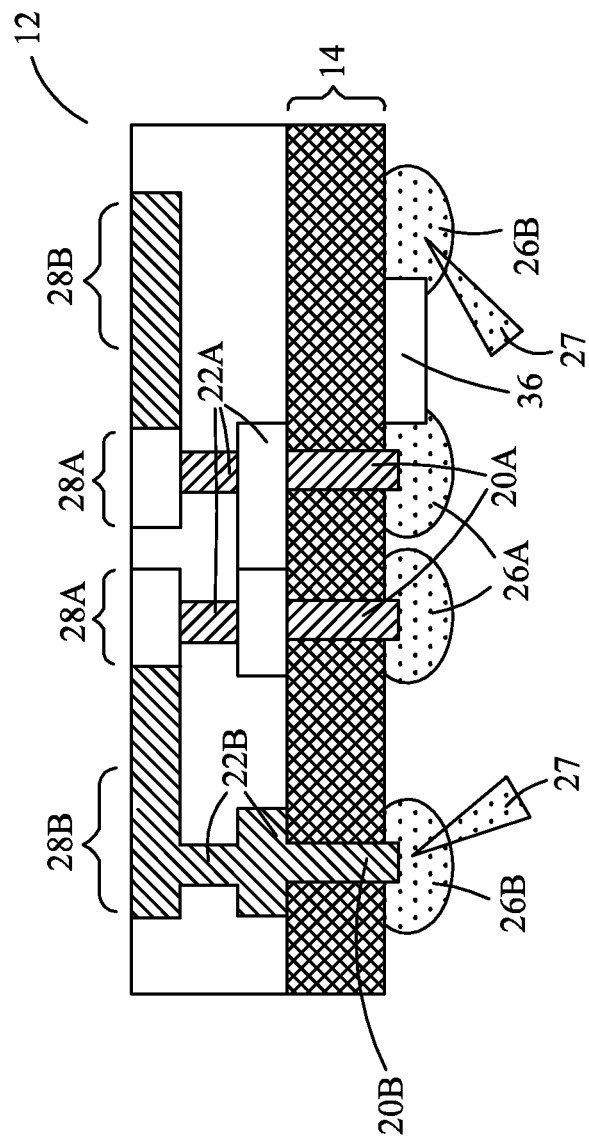
FIG. 6 illustrates the cross-sectional view of an interconnection component in accordance with an alternative embodiment, wherein the interconnection component comprises a redistribution line connecting a dummy solder bump to an active TSV.

FIG. 6 illustrates a cross-sectional view of interconnection component 12 in accordance with various alternative embodiments. Unless specified otherwise, the reference numerals in the following alternative embodiments represent like elements in the embodiments illustrated in FIGS. 1 through 5. In this embodiment, one (or some) of dummy TSVs 20B and the respective connecting dummy metal routing 22B are omitted. Instead, redistribution line (RDL) 36 is formed to electrically connect dummy solder bump 26B (which does not have a respective dummy TSV directly over it) to one of active TSVs 20A. Accordingly, the backside probing may still be performed through dummy solder bumps 26B, and the front side probing may be performed through dummy pads 28B. This embodiment may be used when metal routings are formed on both sides of substrate 14, so that RDL 36 may be formed without introducing extra manufacturing cost.

Figure 7:
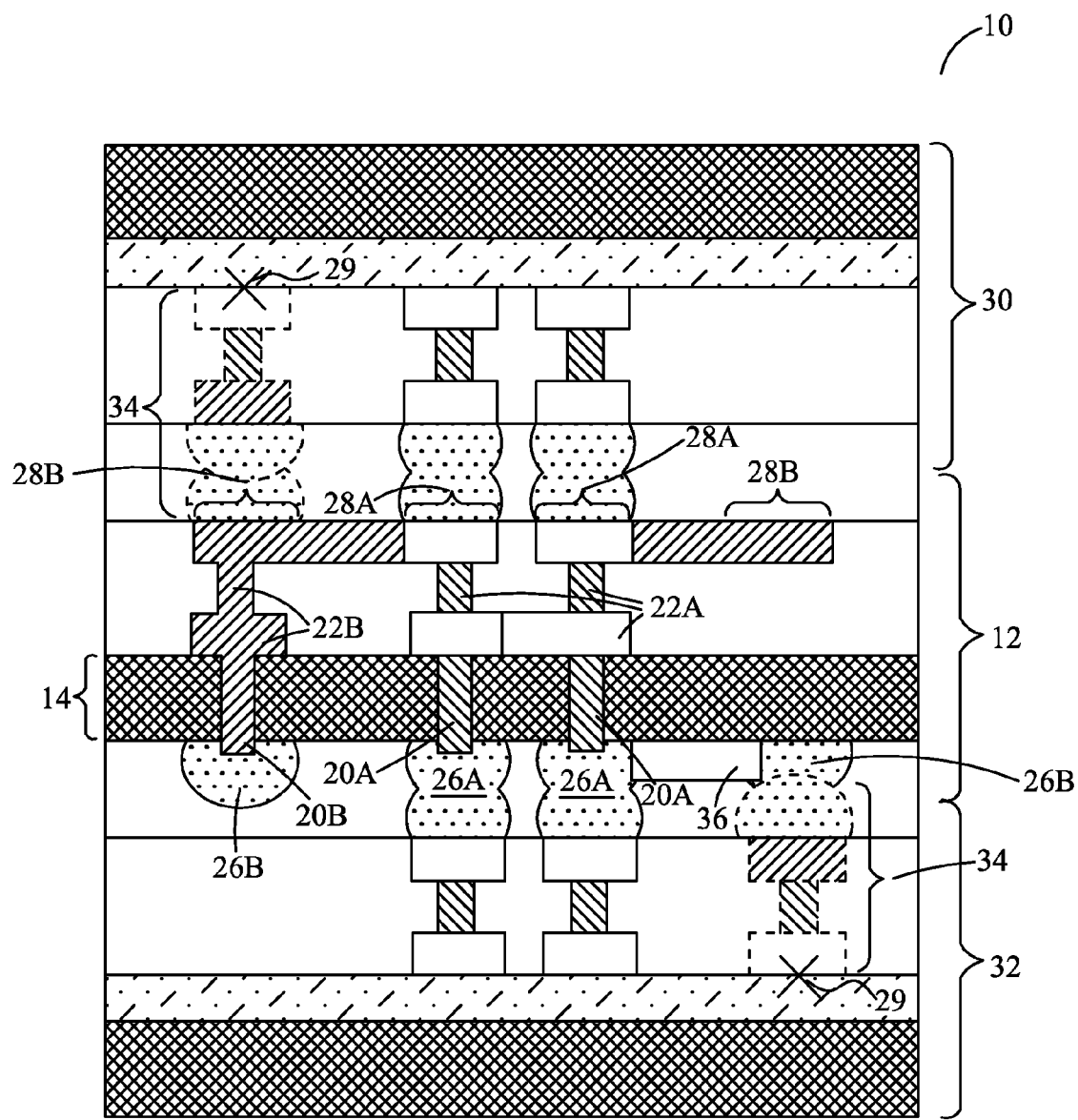
FIG. 7 illustrates a package comprising the interconnection component as shown in FIG. 6 and additional package components bonded to opposite sides of the interconnection component.

FIG. 7 illustrates a package after interconnection component 12 in FIG. 6 is bonded with package components 30 and 32. Furthermore, the top view of the structure as shown in FIG. 7 may also be represented using FIG. 3. The details of this embodiment may be essentially the same as shown in FIGS. 2 and 3, and are not repeated herein. Dummy pads 28B in accordance with embodiments may be covered, or not covered, by package component 30, and may be in contact with molding compound (not shown in FIG. 7, please refer to FIG. 2).

Figure 8:
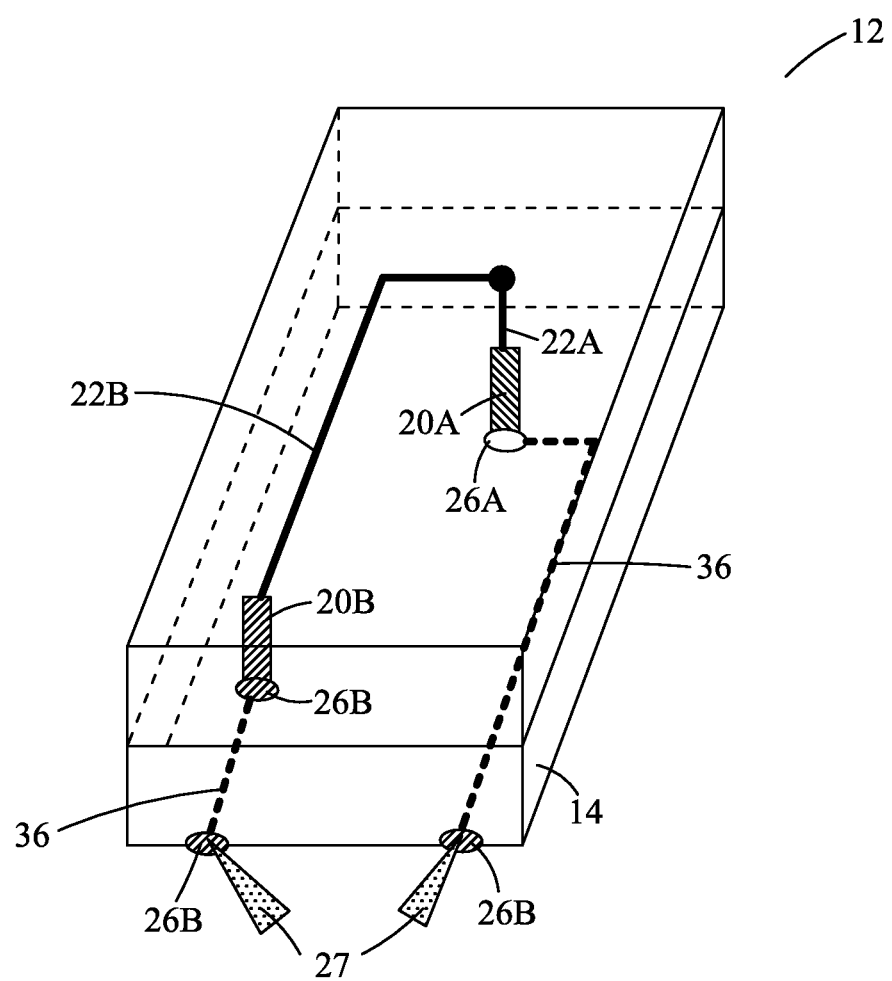
FIGS. 8 and 9 are perspective views of interconnection components comprising dummy redistribution lines.
Figure 9:
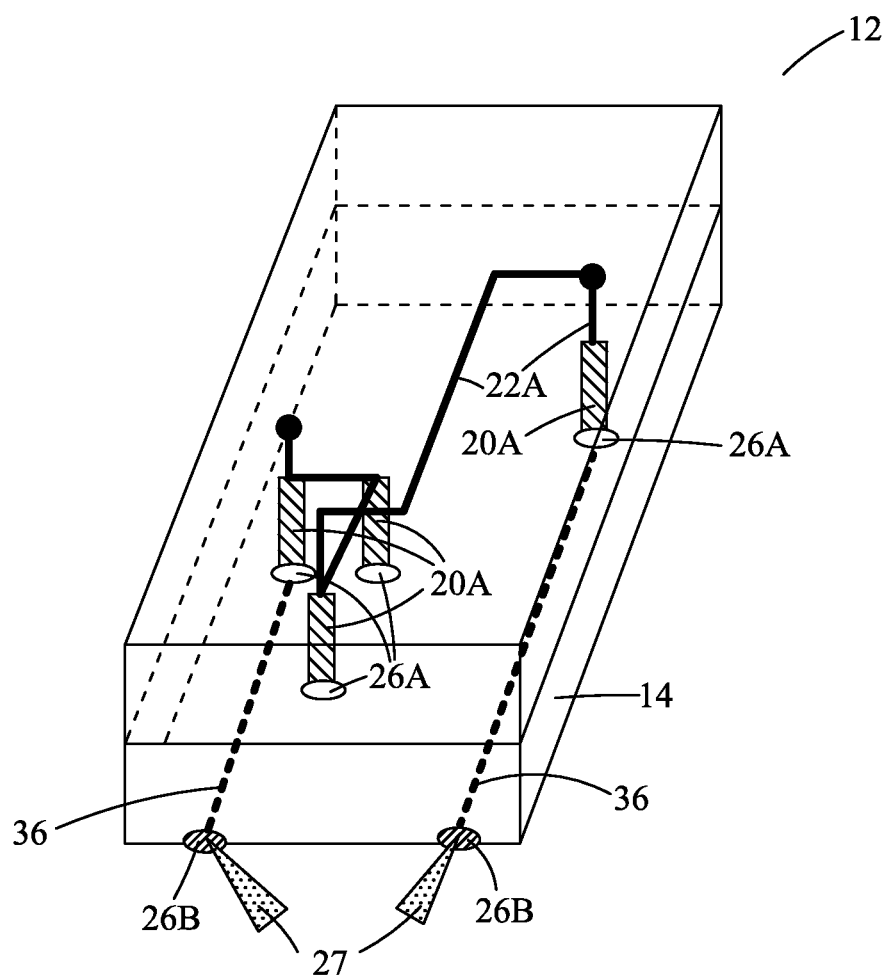

FIGS. 8 and 9 are perspective views of exemplary interconnection components 12 as shown in FIGS. 6 and 7. In FIG. 8, dummy solder bumps 26B are formed, and are electrically connected to one of active TSVs 20A and one of dummy TSVs 20B through RDLs 36, which are located on the backside of substrate 14. Although package component 32 (FIG. 7) is not shown, it may, or may not, be bonded to interconnection components 12 when the probing (symbolized by probe pins 27) through dummy solder bumps 26B is performed. In FIG. 9, dummy solder bumps 26B are illustrated, and are electrically connected to two active TSVs 20A through RDLs 36. Although package component 32 (FIG. 7) is not shown, it may, or may not, be bonded to interconnection components 12 when the probing through dummy solder bumps 26B is performed.

Figure 10:
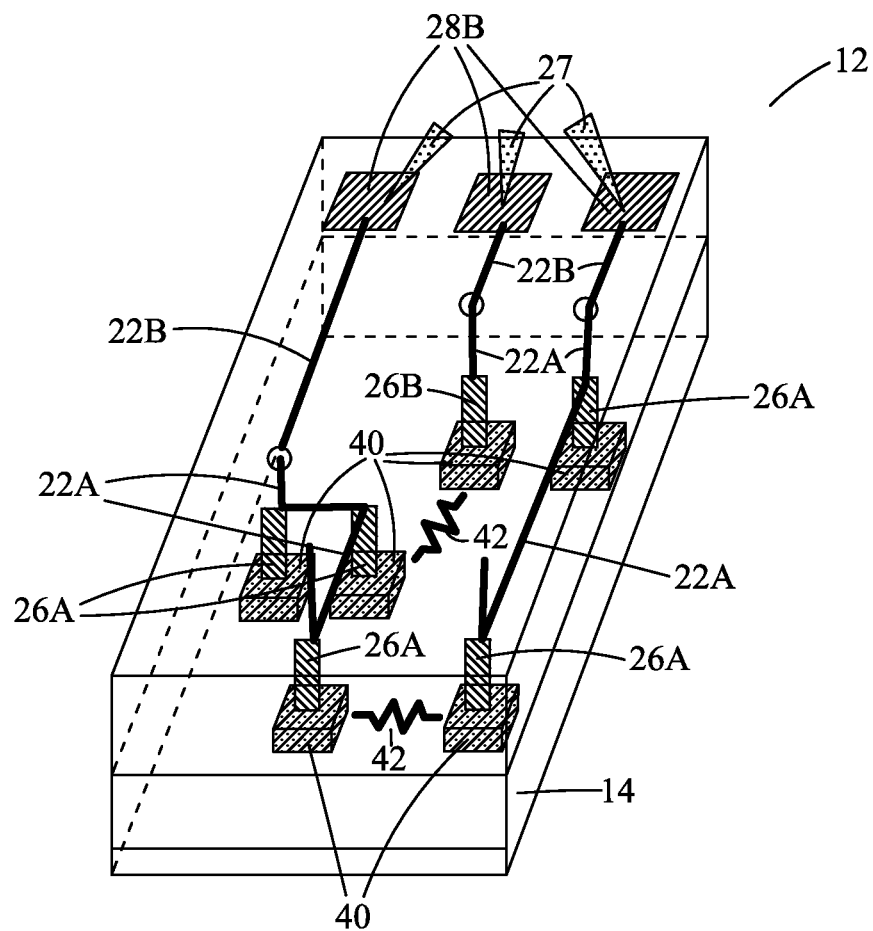
FIG. 10 illustrates a perspective view of an interconnection component in accordance with various alternative embodiments, wherein heavily doped regions are formed in the substrate in the interconnection component, and wherein the heavily doped regions are electrically connected to dummy TSVs and active TSVs.

FIGS. 10 through 13 illustrate intermediate stages in the formation of a package structure in accordance with various alternative embodiments. Referring to FIG. 10, during the manufacturing of interconnection component 12, and before the formation of backside features such as solder bumps 26A and 26B (FIGS. 1 and 6), and the like, on the backside of interconnection component 12, heavily doped regions 40 may be formed. In an embodiment, a P+ ion implantation may be performed to form heavily doped p-type (P+) regions 40 in substrate 14. Dummy pads 28B are still formed on the front side of interconnection component 12, and are used for probing (illustrated by probe pins 27).

Figure 11:
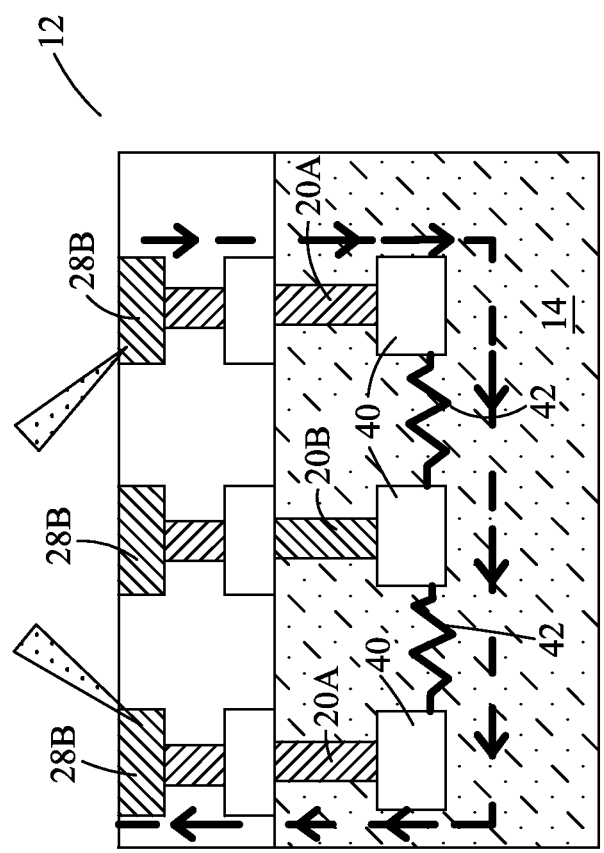
FIG. 11 illustrates a cross-sectional view of an interconnection component including the heavily doped regions.

FIG. 11 illustrates a cross-sectional view of the structure shown in FIG. 10. Dummy TSV 20B is added for testing purpose. Dummy TSV 20B and active TSV 20A are electrically connected to, and in physical contact with, underlying P+ ion implantation regions 40. In an embodiment wherein substrate 14 is a semiconductor substrate such as a silicon substrate, parasitic resistor 42 exist between P+ ion implantation regions 40, and the resistance values of parasitic resistors 42 are related to the distances between P+ ion implantation regions 40. By probing through dummy pads 28B, the metal connection between dummy pads 28 and P+ ion implantation regions 40 may be probed, and defect connections may be found. Dummy TSV(s) 20B and the respective P+ ion implantation regions 40 may be added to selected positions, so that the resistance values of resistors 42 may fall into a desirable range.

Figure 12:
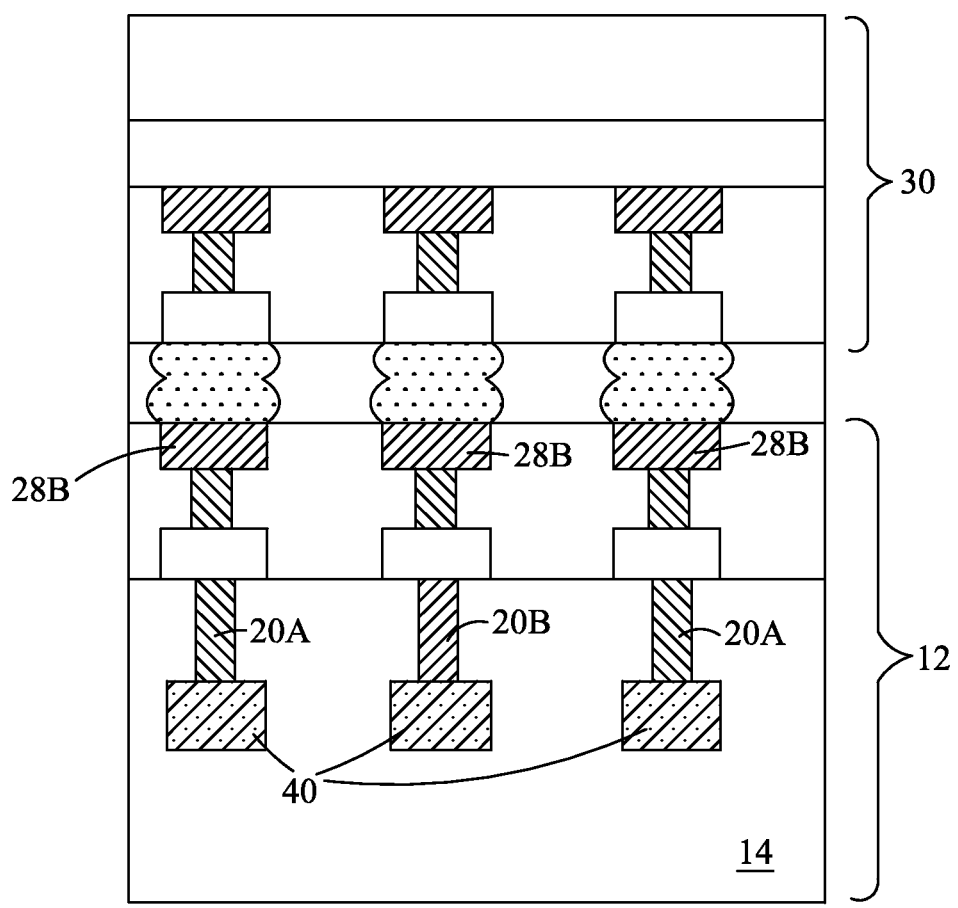
FIG. 12 illustrates an intermediate stage in the formation of the package structure including the interconnection component in FIG. 11, wherein an additional package component is bonded to the interconnection component.
Figure 13:
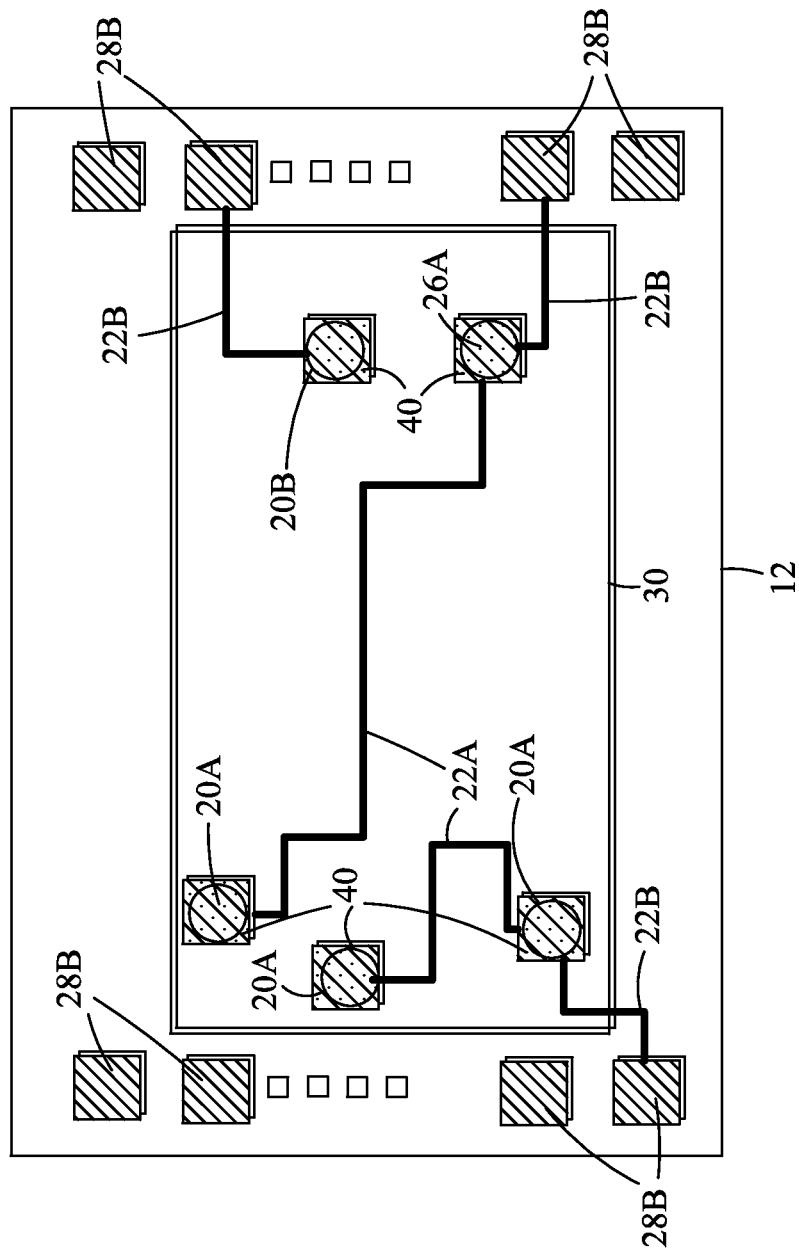
FIG. 13 illustrates a top view of the package structure in FIG. 12.

The probing step shown in FIGS. 10 and 11 may be performed before or after package component 30 is bonded onto interconnection component 12. For example, FIG. 12 illustrates the bonding of interconnection component 12 that is bonded with package component 30. At this time, a backside grinding has not been performed to substrate 14. FIG. 13 illustrates a top view of interconnection component 12 and package component 30. As shown in FIG. 13, some or all of dummy pads 28B may not be covered by package component 30. Accordingly, the probing may be performed through the exposed dummy pads 28 even after package component 30 has been bonded to interconnection component 12. In subsequent steps, a backside grinding may be performed on substrate 14 (FIG. 12) from the bottom side as shown in FIG. 12. P+ ion implantation regions 40 are removed by the grinding. Next, bond pads may be formed on the backside of substrate 14, and active and dummy solder bumps 26 may be formed. The resulting structure may be essentially the same as shown in FIGS. 1 and 6.

By using the embodiments, there is no need to form loopback devices in order to test the connections in interconnection component 12. Instead, dummy TSVs, dummy solder bumps, dummy pads, and/or dummy metal connections are formed inside interconnection component 12. Therefore, there is no extra cost for forming the test structures. In addition, the test structures may be used to test the connection with the proceeding of the packaging processes.

In accordance with embodiments, an interconnection component includes a substrate, and a TSV penetrating through the substrate. Active metal connections are formed over the substrate and electrically connected to the active TSV. At least one of a dummy pad and a dummy solder bump are formed at surfaces of the interconnection component. The dummy pad is over the substrate and electrically connected to the active TSV and the active metal connections. The dummy solder bump is under the substrate and electrically connected to the active metal connections. The dummy pad and the dummy solder bump are open ended.

In accordance with other embodiments, a circuit structure includes an interposer free from active devices formed therein. The interposer includes a substrate, and an active TSV and a dummy TSV penetrating through the substrate. Active metal connections electrically interconnect the active TSV and the dummy TSV. A dummy pad configured to be used as a probe pad is located on a first surface of the substrate, wherein the dummy pad is electrically connected to the active metal connections. A dummy solder bump is located on a second surface of the substrate and electrically connected to the active TSV and the active metal connections, wherein the dummy pad and the dummy solder bump are on opposite surfaces of the interposer. A first package component is bonded to the first surface of the interposer. A second package component is bonded to the second surface of the interposer. The dummy solder bump is between the interposer and the second package component, and is not electrically connected to conductive features inside the package component.

In accordance with yet other embodiments, a method includes forming an interposer, which includes forming a TSV in a substrate of the interposer, and forming metal connections over and electrically connected to the active TSV and the dummy TSV. The step of forming the interposer further includes forming a dummy pad and a dummy solder bump electrically connected to the metal connections, wherein the dummy solder bump and the dummy pad are on opposite sides of the substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A circuit structure comprising:
   an interposer free from active devices formed therein, wherein the interposer comprises:
   a substrate;
   an active through-substrate via (TSV) and a dummy TSV penetrating through the substrate;
   active metal connections electrically interconnecting the active TSV and the dummy TSV;
   a dummy pad configured to be used as a probe pad on a first surface of the substrate, wherein the dummy pad is electrically connected to the active metal connections; and
   a dummy solder bump on a second surface of the substrate and electrically connected to the active TSV and the active metal connections, wherein the dummy pad and the dummy solder bump are on opposite surfaces of the interposer;
   a first package component bonded to the first surface of the interposer; and
   a second package component bonded to the second surface of the interposer, wherein the dummy solder bump is between the interposer and the second package component, and is not electrically connected to conductive features inside the package component.

2. The circuit structure of claim 1, wherein the first package component is smaller in size than the interposer, and wherein the dummy pad is not covered by the first package component.

3. The circuit structure of claim 2 further comprising a molding compound directly over and contacting the dummy pad.

4. The circuit structure of claim 3 further comprising:
   a dummy redistribution line (RDL) electrically connecting the dummy solder bump to the active TSV, wherein the dummy RDL and the active metal connections are on opposite sides of the substrate.

5. The circuit structure of claim 3 further comprising:
a dummy TSV in the substrate and electrically connected between the active metal connections and the dummy solder bump.

\* \* \* \* \*